United States Patent
Mertol

[19]

[11] Patent Number: 5,866,943

[45] Date of Patent: Feb. 2, 1999

[54] SYSTEM AND METHOD FOR FORMING A GRID ARRAY DEVICE PACKAGE EMPLOYING ELECTOMAGNETIC SHIELDING

[75] Inventor: Atila Mertol, Cupertino, Calif.

[73] Assignee: LSI Logic Corporation, Milpitas, Calif.

[21] Appl. No.: 881,111

[22] Filed: Jun. 23, 1997

[51] Int. Cl.[6] .............................. H01L 23/34; H01L 23/10
[52] U.S. Cl. ......................... 257/712; 257/659; 257/706; 257/713; 257/778
[58] Field of Search ................................... 257/706, 707, 257/659, 691, 778, 712, 713, 660

[56] References Cited

U.S. PATENT DOCUMENTS

| | | | |
|---|---|---|---|
| 5,371,404 | 12/1994 | Juskey et al. ............................ | 257/787 |
| 5,552,635 | 9/1996 | Kim et al. ................................ | 257/712 |
| 5,737,191 | 4/1998 | Horiuchi et al. ......................... | 257/787 |
| 5,744,863 | 4/1998 | Culnane et al. ......................... | 257/713 |

OTHER PUBLICATIONS

Internet publication entitled, "Basic Concepts of EMI," by Chomerics: EMI, Jun. 17, 1997, pp. 1–5.

*Primary Examiner*—Peter Toby Brown
*Assistant Examiner*—Hung Van Duong

[57] ABSTRACT

A system and method are presented for forming a grid array device package around an integrated circuit (i.e., chip), the packaged device incorporating electromagnetic shielding. Embodiments of the packaged device include an integrated circuit, a substrate, and a thermally and electrically conductive heat spreader. The integrated circuit includes multiple input/output (I/O) pads on an underside surface divided into a central portion and a surrounding peripheral portion. Members of the central portion are connected to corresponding bonding pads on an upper surface of the substrate using the controlled collapse chip connection (C4) method. Members of the peripheral portion are connected to an electrical ground potential. One end of a grounding lead is attached to each member of the peripheral portion of the I/O pads such that the remaining free end extends outward from the integrated circuit. The grounding leads may be, for example, metal foil strips or wires. The free ends of the grounding leads are electrically coupled to the heat spreader, maintaining the heat spreader at the ground potential and forming an electromagnetic shield about the integrated circuit. In two embodiments, the packaged device includes an electrically conductive stiffener used to help the substrate maintain its planar shape during and after C4 heating. The grounding leads maintain the heat spreader and the stiffener at the ground potential. In another embodiment, the stiffener is omitted, the integrated circuit resides within a cavity of the heat spreader, and the grounding leads maintain the heat spreader at the ground potential.

12 Claims, 4 Drawing Sheets

SYSTEM AND METHOD FOR FORMING A GRID ARRAY DEVICE PACKAGE EMPLOYING ELECTOMAGNETIC SHIELDING

BACKGROUND OF THE INVENTION

1. Field of Invention

This invention relates to semiconductor device packages, and more particularly to grid array packages using the controlled collapse chip connection (C4) method to attach an integrated circuit (i.e., a chip) to a substrate.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffers as a result.

Controlled collapse chip connection (C4) is a well known method of attaching an integrated circuit chip directly to a PCB, and is commonly referred to as the "flip chip" method. In preparation for C4 attachment, the I/O pads of the chip are typically arranged in a two-dimensional array upon an underside of the chip, and a corresponding set of bonding pads are formed upon an upper surface of the PCB. A solder bump is formed upon each of the I/O pads of the chip. During C4 attachment of the chip to the PCB, the solder bumps are placed in physical contact with the bonding pads of the PCB. The solder bumps are then heated long enough for the solder to flow. When the solder cools, the I/O pads of the chip are electrically and mechanically coupled to the bonding pads of the PCB. After the chip is attached to the PCB, the region between the chip and the PCB is filled with an "underfill" material which encapsulates the C4 connections and provides other mechanical advantages.

Like flip chips, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged in a two-dimensional array across the underside surface of the device package. Members of the second set of bonding pads function as device package terminals, and are coated with solder. The resulting solder balls on the underside of the BGA device package allow the device to be surface mounted to an ordinary PCB. The I/O pads of the chip are typically connected to corresponding members of the first set of bonding pads by signal lines (e.g., fine metal wires). The substrate includes one or more layers of signal lines (i.e., interconnects) which connect respective members of the first and second sets of bonding pads. During PCB assembly, the BGA device package is attached to the PCB by reflow of the solder balls just as a flip chip is attached to a PCB.

Semiconductor devices (e.g., integrated circuit chips) dissipate electrical power during operation, transforming electrical energy into heat energy. For high performance devices, such as microprocessors, specified performance is only achieved when the temperature of the device is below a specified maximum operating temperature. The heat energy produced by a semiconductor device during operation must thus be removed to the ambient environment at a rate which ensures operational and reliability requirements are met. The operating temperature of an integrated circuit chip enclosed within a semiconductor device package is thereby governed by: (i) the temperature of the ambient surrounding the device package, (ii) the amount of electrical power dissipated by the chip, and (ii) the sum of thermal resistances of elements and interfaces along a heat transfer path from the chip to the ambient. More complex heat transfer (i.e., cooling) mechanisms, such as heat sinks and forced air cooling, permit semiconductor devices to dissipate more electrical power than direct exposure to the ambient would otherwise allow.

The very short signal transition times of modern high frequency digital circuits also create potential problems. The short transition times require relatively large switching transient currents in order to charge and discharge capacitive loads quickly. The impedances of conductors carrying these large transient currents result in voltage transients. Such voltage transients result in ground "bounce", power supply "droop", and reduced noise margins of logic devices connected to these conductors. These voltage transients have significant high frequency components, and may be coupled into other circuit conductors located nearby. The high frequency components of these transient voltages also increase the levels of radiated electromagnetic interference (EMI).

It would be beneficial to have a packaged integrated circuit device including an integrated circuit chip enclosed within a semiconductor device package, wherein the device package includes grid array terminals, and wherein the chip is mounted upon a substrate of the device package using the C4 or flip chip attachment method. C4 attachment would beneficially reduce many of the problems associated with using fine metal wires to connect the I/O pads of the chip to corresponding bonding pads of the BGA package, including wire crossover problems and the added electrical inductances of the wires. It would be further desirable to surround the chip with electrically conductive elements, and connect these elements to a ground potential. Proper design of a ground about the chip will minimize radiation of electrical energy from, and coupling of electrical energy into, electrical circuits of the chip during operation.

SUMMARY OF THE INVENTION

The problems outlined above are in large part solved by a system and method for forming a grid array device package around an integrated circuit, wherein the packaged device incorporates electromagnetic shielding. Contemplated embodiments of a packaged integrated circuit device include an integrated circuit, a substrate, and a thermally and electrically conductive heat spreader. The integrated circuit includes at least one electronic device formed upon a monolithic semiconductor substrate. The integrated circuit also includes multiple electrical contacts (i.e., I/O pads) on an underside surface, preferably arranged in a two-dimensional array. The I/O pads of the integrated circuit are classified according to where they are placed across the integrated circuit surface. I/O pad arranged at or near the center of the integrated circuit are deemed "central pads" which transmit various signals, as well as power and ground potentials. However, I/O pads exclusive of those near the center (i.e., I/O pads at the surrounding peripheral regions of the integrated circuit surface) are deemed "peripheral pads" and transmit only ground potential. I/O pads within the peripheral portion are connected to an electrical ground potential, preferably to grounded elements (i.e., junctions, conductors, etc.) arranged throughout the integrated circuit. When the I/O pads are arranged as a two dimensional array having rows and columns, for example, the peripheral pads may be the outermost one or two rows and columns. The heat spreader is thermally coupled to the integrated circuit and electrically coupled to the members of the peripheral portion of the I/O pads (i.e., peripheral pads). The heat spreader is connective to the electrical ground voltage applied to the peripheral pads to form an electromagnetic shield about the integrated circuit.

Prior to C4 mounting of the integrated circuit upon the substrate, one end of a grounding lead is attached to each member of the peripheral I/O pads such that the remaining free end extends outwardly from the integrated circuit. The grounding leads may be, for example, metal foil strips or wires. During the packaging operation, the free ends of the grounding leads (i.e., the ends of the grounding leads not attached to the peripheral pads) are electrically coupled to the heat spreader, maintaining the heat spreader at the ground potential.

The substrate is substantially planar, and includes a first set of electrical contacts (i.e., bonding pads) on an upper surface and a second set of bonding pads on an opposed underside surface. The first and second sets of bonding pads are preferably arranged in two-dimensional arrays. The lateral dimensions (i.e., sizes) of the I/O pads of the integrated circuit and members of the first set of bonding pads of the substrate are substantially equal, and the first set of bonding pads of the substrate are configured to vertically align with corresponding central pads. The substrate also includes multiple layers of a patterned conductive material forming electrical conductors or "traces". The traces electrically and, to some degree thermally, connect members of the first and second sets of bonding pads.

The integrated circuit (i.e., chip) is connected to the upper surface of the substrate using the C4 method. During the C4 process, solder bumps covering members of the central portion of the I/O pads are brought into contact with corresponding members of the first set of bonding pads. The solder bumps are heated until they flow, connecting the central pads to corresponding pads of the first set of bonding pads.

A first embodiment of the packaged integrated circuit includes a substantially rigid and planar stiffener positioned between the substrate and the heat spreader. The stiffener includes an opening (i.e., a hole) extending possibly through the stiffener such that the hole is dimensioned to receive the integrated circuit. The stiffener is attached to the upper surface of the substrate prior to the C4 process and such that the first set of contacts of the substrate are exposed through the opening. The stiffener maintains its substantially planar shape when exposed to a maximum C4 temperature of about 230 degrees C, and helps the substrate maintain its planarity during and after the C4 process.

The integrated circuit is mounted within a cavity formed by the substrate upper surface and the stiffener inner surface. The stiffener surfaces are those formed as a result of the opening, or are those which face inward toward the integrated circuit. This cavity may be substantially filled with a thermally conductive C4 underfill material. Alternately, the portion of the cavity between the underside of the integrated circuit and the corresponding portion of the upper surface of the substrate may be filled with underfill material, and the remaining portion of the cavity between the integrated circuit and the stiffener inner surface may be filled with a thermal interface material (e.g., thermal grease). The underfill material encapsulates the C4 solder bump connections and provides other mechanical advantages.

Following the C4 process, a select quantity of a thermally conductive thermal interface material which flows under pressure (e.g., thermally conductive epoxy or thermal grease) is preferably deposited in the center of the upper surface of the integrated circuit, and the free ends of the grounding leads are positioned over the upper surface of the stiffener. An electrically and thermally conductive adhesive material which flows under pressure is deposited upon the upper surface of the stiffener such that the free ends of the grounding leads are covered by the adhesive. The heat spreader is then positioned above and lowered onto the stiffener and the integrated circuit. Sufficient downward pressure is applied to the upper surface of the heat spreader such that the thermal interface material spreads out between the upper surface of the integrated circuit and the adjacent portion of the underside surface of the heat spreader to form a thermal interface layer therebetween. The thermal interface layer is preferably only a "bond line thickness" of the thermal interface material in order to reduce the thermal resistance between the integrated circuit and the heat spreader. The electrically and thermally conductive adhesive material deposited upon the upper surface of the stiffener and the grounding leads spreads out to form an adhesive layer which attaches the underside surface of the heat spreader to the upper surface of the stiffener. The electrically and thermally conductive adhesive material electrically and thermally couples the heat spreader to the stiffener and to the grounding leads. As a result, the heat spreader and the stiffener are maintained at the ground potential, forming an electromagnetic shield about the integrated circuit.

In a second embodiment, the underside surface of the heat spreader has a cavity dimensioned to receive the integrated circuit. In this case, the stiffener is omitted, and the substrate maintains its substantially planar shape during and after C4 heating. The underside surface of the heat spreader is attached to the upper surface of the substrate such that the integrated circuit resides within the cavity. As before, a select quantity of a thermally conductive thermal interface material which flows under pressure (e.g., thermally conductive epoxy or thermal grease) is preferably deposited in the center of the upper surface of the integrated circuit. The free ends of the grounding leads are positioned over the upper surface of the substrate, and an electrically and thermally conductive adhesive material which flows under pressure is deposited upon the upper surface of the substrate surrounding the integrated circuit such that the free ends of the grounding leads are covered by the adhesive. The heat spreader is then positioned above and lowered onto the integrated circuit and the substrate. Sufficient downward pressure is applied to the upper surface of the heat spreader such that the thermal interface material spreads out between the upper surface of the integrated circuit and an upper wall of the cavity of the heat spreader to form a thermal interface layer therebetween. The thermal interface layer is again preferably only a "bond line thickness" of the thermal interface material in order to reduce the thermal resistance between the integrated circuit and the heat spreader. The electrically and thermally conductive adhesive material deposited upon the upper surface of the substrate and the grounding leads spreads out to form an adhesive layer which attaches the underside surface of the heat spreader to the upper surface of the substrate. The electrically and thermally conductive adhesive material thermally couples the heat spreader to the substrate and electrically couples the heat spreader to the grounding leads.

A third embodiment of the packaged integrated circuit includes the substantially rigid and planar stiffener, the substrate, and the heat spreader of the first embodiment. In this case, however, the stiffener is attached to the upper surface of then substrate following the coupling of the I/O pads of the integrated circuit to corresponding members of the first set of bonding pads of the substrate. As in the second embodiment, the substrate maintains its substantially planar shape during and after C4 heating.

Following the mounting of the integrated circuit upon the upper surface of the substrate, an electrically and thermally conductive adhesive material is deposited about the perimeter of the upper surface of the substrate and around the free ends of the grounding leads. The stiffener is then placed upon the adhesive material, forming a layer of the adhesive material between the stiffener and the substrate which attaches the stiffener to the substrate. Following attachment of the stiffener to the upper surface of the substrate, a cavity is formed between the integrated circuit, the stiffener, and the substrate. As in the first embodiment, the cavity may be substantially filled with a thermally conductive C4 underfill material. Alternately, a portion of the cavity between the underside of the integrated circuit and the corresponding portion of the upper surface of the substrate may be filled with the underfill material, and the remaining portion of the cavity between the side surfaces of the integrated circuit and the side walls of the opening in the stiffener may be filled with a thermal interface material (e.g., thermally conductive epoxy or thermal grease).

Following the attachment of the stiffener and the underfill process, a select quantity of a thermally conductive thermal interface material which flows under pressure (e.g., thermally conductive epoxy or thermal grease) is preferably deposited in the center of the upper surface of the integrated circuit, and an electrically and thermally conductive adhesive material which flows under pressure is deposited upon the upper surface of the stiffener. The heat spreader is then positioned above and lowered onto the stiffener and the integrated circuit. As in the first embodiment, sufficient downward pressure is applied to the upper surface of the heat spreader such that the thermal interface material spreads out between the upper surface of the integrated circuit and the adjacent portion of the underside surface of the heat spreader to form a thermal interface layer therebetween. Again, the thermal interface layer is preferably only a "bond line thickness" of the thermal interface material in order to reduce the thermal resistance between the integrated circuit and the heat spreader. The electrically and thermally conductive adhesive material deposited upon the upper surface of the stiffener spreads out to form an adhesive layer which attaches the underside surface of the heat spreader to the upper surface of the stiffener. The electrically and thermally conductive adhesive material electrically and thermally couples the heat spreader to the stiffener. As a result, the heat spreader and the stiffener are maintained at the ground potential, forming an electromagnetic shield about the integrated circuit.

BRIEF DESCRIPTION OF THE DRAWINGS

Other objects and advantages of the invention will become apparent upon reading the following detailed description and upon reference to the accompanying drawings in which.

Figure 1:
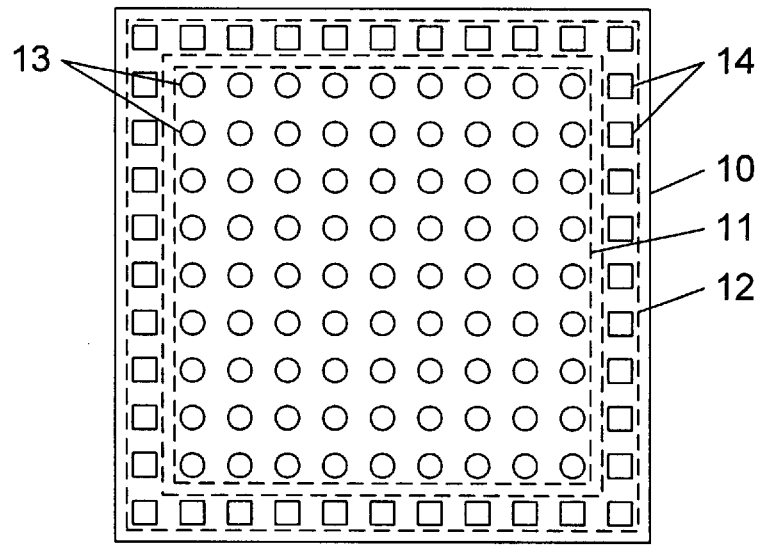
FIG. 1 is a plan view of an underside surface of one embodiment of an integrated circuit (i.e., chip) manufactured in accordance with the present invention, wherein the chip includes multiple electrical contacts (i.e., I/O pads) formed upon the underside surface, and wherein the I/O pads are divided into a central portion and a surrounding peripheral portion, and wherein members of the peripheral portion receive only ground voltage through an electrical ground potential.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a plan view of an underside surface of one embodiment of an integrated circuit (i.e., chip) 10 manufactured in accordance with the present invention. Chip 10 includes one or more electronic devices formed upon a monolithic semiconductor substrate. Chip 10 also includes multiple input/output (I/O) pads arranged upon the underside surface, preferably in a two-dimensional array. The I/O pads are divided into a central portion 11 and a surrounding peripheral portion 12. Members of the central portion 11 are covered with solder, forming solder bumps 13 which function as I/O terminals of chip 10. At least one of the members of central portion 11, or central pads, is connected to a positive lead of a supply of electrical power (i.e., power supply), and at least one other member of central portion 11 is connected to a negative (i.e., ground) lead of the power supply. Members of peripheral portion 12, or peripheral pads, are deemed grounding pads 14. Grounding pads 14 are connected within chip 10 to the ground lead of the power supply, preferably to a ground plane within chip 10. Grounding pads 14 are used to receive electrical coupling from grounding leads which, when connected to a ground supply routed to the device package surrounding chip 10, form grounded elements upon chip 10 as well as a grounded electromagnetic shield surrounding chip 10.

Figure 2:
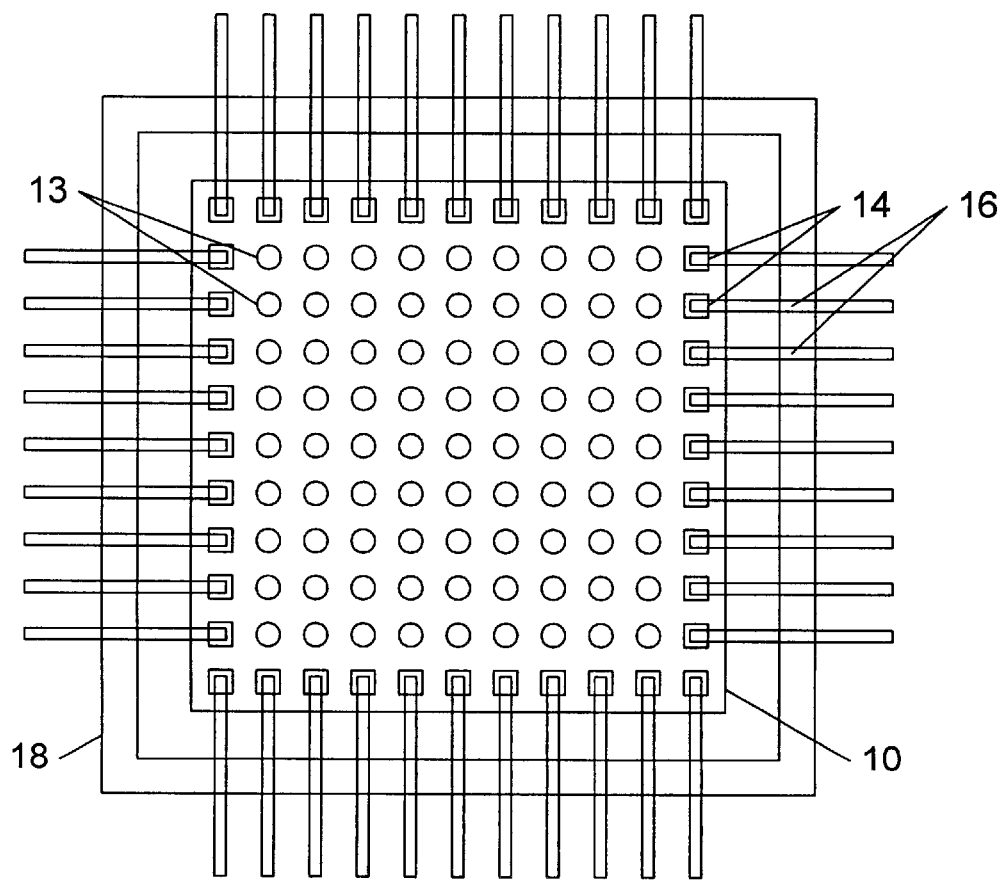
FIG. 2 is a plan view of the underside surface of the chip of FIG. 1 wherein one end of a grounding lead (e.g., a metal foil strip or wire) is attached to each of the peripheral pads, or grounding pads, in order to facilitate electrical connection to package elements.

FIG. 2 is a plan view of the underside surface of chip 10 with grounding leads 16 attached to grounding pads 14. One end of a grounding lead 16 is attached to each grounding pad 14 such that the grounding lead extends outwardly from chip 10, past the outer boundary of chip 10. Grounding leads 16 may be, for example, strips of metal (e.g., copper) foil, or pieces of metal (e.g., copper) wire. Grounding leads 16 may be attached to grounding pads 14 using well known bonding techniques such as tape automated bonding ("TAB") (i.e., bonding with foil strips) or wire bonding (i.e., bonding with wires). TAB techniques involve forming solder "bumps" upon grounding pads 14, the ends of foil strip grounding leads 16, or both, then attaching the ends of grounding leads 16 to grounding pads 14 using pressure and enough heat to cause the solder to flow (i.e., "reflow"). A typical wire bonding technique may also use heat and/or pressure to attach the ends of wire grounding leads 16 to grounding pads 14. A carrier film 18 (e.g., adhesive tape) may be used to hold grounding leads 16 in a desired arrangement relative to one another during the bonding process.

Figure 3:
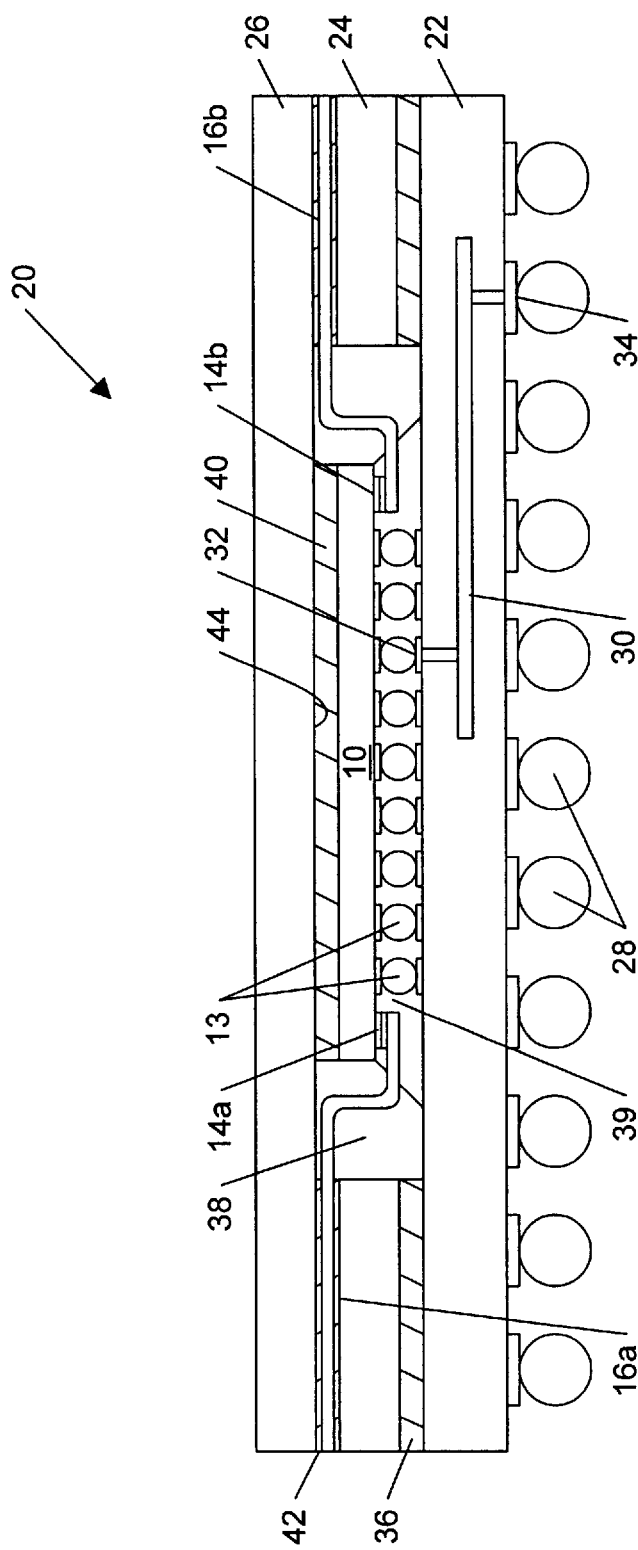
FIG. 3 is a cross-sectional view of a first embodiment of a semiconductor device employing electromagnetic shielding in accordance with the present invention, wherein the semiconductor device includes the integrated circuit of FIG. 2 and an electrically conductive stiffener and heat spreader which partially enclose the integrated circuit, and wherein the grounding leads, interposed between the stiffener and the heat spreader, electrically couple the heat spreader and the stiffener to the electrical ground potential, thereby forming an electromagnetic shield about the integrated circuit.

FIG. 3 is a cross-sectional view of a first embodiment of a semiconductor device 20 employing the electromagnetic shielding of the present invention. Semiconductor device 20 includes chip 10, a substrate 22, a stiffener 24, and a heat spreader 26. Substrate 22 is preferably substantially fiberglass-epoxy material, however, should not be classified as a printed circuit board ("PCB") in the typical sense. Alternately, substrate 22 may substantially be, for example, a ceramic material (e.g., aluminum oxide or aluminum nitride). Chip 10 is mounted upon substrate 22 using the controlled collapse chip connection (C4) or "flip chip" method described above. Substrate 22 includes two sets of bonding pads; a first set of bonding pads on an upper surface and a second set of bonding pads on an opposed underside surface. The first and second sets of bonding pads are preferably arranged in two-dimensional arrays. Members of the first set of bonding pads have substantially the same lateral dimensions (i.e., are approximately the same size) as the I/O pads of chip 10 and are configured to vertically align with the I/O pads of chip 10. The second set of bonding pads may be covered with solder, forming solder balls 28 as shown in FIG. 3 which function as terminals of semiconductor device 20. Alternately, the second set of bonding pads may have pins for connecting to a PCB or for inserting into a socket.

Substrate 22 also includes one or more patterned horizontal layers of electrically conductive material forming electrical conductors connecting members of the first and second sets of bonding pads. A layer of the dielectric material of substrate 22 (i.e., fiberglass-epoxy or ceramic material) separates adjacent horizontal conductive layers, electrically isolating the conductive layers. In FIG. 3, an exemplary horizontal trace conductor 30 electrically connects a bonding pad 32 of the first set of bonding pads to a bonding pad 34 of the second set of bonding pads with the help of vertical conductive vias. The bonding pad 32 to which conductor 30 is coupled is preferably a central pad, instead of a peripheral pad or grounding pad if bonding pad carries a signal other than ground—which is the typical arrangement.

Stiffener 24 is a rigid structure made of an electrically and thermally conductive material, preferably a metal (e.g., copper or aluminum). Stiffener 24 is preferably dimensioned to substantially cover the upper surface of substrate 22. Stiffener 24 includes an opening (i.e., a hole) extending from an upper surface to an underside surface of stiffener 24 substantially in the center of stiffener 24. When stiffener 24 is positioned over the upper surface of substrate 22, the opening exposes the first set of bonding pads of substrate 22. The opening is dimensioned to receive chip 10. Stiffener 24 is attached to the upper surface of substrate 22 by an adhesive layer 36 prior to the C4 mounting of chip 10 upon substrate 22. Adhesive layer 36 may be, for example, a layer of an epoxy including particles of a thermally conductive material (e.g., silver, aluminum, boron nitride, etc.). A suitable adhesive material is Abelstik No. 965-1L, a silver-filled epoxy (Abelstik Co., Rancho Dominguez, Calif.).

During the C4 mounting process, solder bumps 13 of chip 10 are vertically aligned over and brought into contact with corresponding members of the first set of bonding pads on the upper surface of substrate 22. Heat is then applied to solder bumps 13 to cause solder bumps 13 to flow, connecting I/O pads of chip 10 to the corresponding members of the first set of bonding pads. Stiffener 24 retains a substantially planar shape when exposed to maximum C4 temperatures of about 230 degrees Celsius. Stiffener 24 helps keep substrate 22 substantially planar during and after the C4 mounting process. The vertical thickness of stiffener 24 is selected such that the upper surface of chip 10 is substantially even with the upper surface of stiffener 24 following C4 mounting of chip 10 to substrate 22.

Following the mounting of chip 10 upon the upper surface of substrate 22, a cavity 38 is formed between chip 10, stiffener 24, and substrate 22. Cavity 38 is bounded by the upper surface of substrate 22 surrounding the first set of bonding pads, the side walls of the opening in stiffener 24, the side surfaces of chip 10, and the underside surface of chip 10. Cavity 38 may be substantially filled with a thermally conductive C4 underfill material. Alternately, a portion 39 of cavity 38 between the underside of chip 10 and the corresponding portion of the upper surface of substrate 22 may be filled with the underfill material, and the remaining portion of the cavity between the side surfaces of chip 10 and the side walls of the opening in stiffener 24 may be filled with a thermal interface material (e.g., thermally conductive epoxy or thermal grease).

The C4 underfill material may be, for example, a liquid which hardens over time. The liquid may be initially dispensed along one or more sides of chip 10, using capillary action to fill the space between the underside of chip 10 and the corresponding portion of the upper surface of substrate 22. For example, the underfill material may be an epoxy compound including suspended particles of a thermally conductive and electrically insulating material (e.g., silica). A suitable adhesive material is Dexter HYSOL® No. 4527, a silica-filled epoxy (Dexter Electronic Materials, Industry, CA). The underfill material encapsulates the C4 connections and provides other mechanical advantages. The underfill material (or thermal interface material) which brings the side surfaces of chip 10 into thermal communication with stiffener 24 provides additional thermal paths for heat energy to flow from chip 10 to the ambient via stiffener 24, heat spreader 26, and substrate 22.

Heat spreader 26 is a plate formed from an electrically and thermally conductive material (e.g., a metal such as aluminum). Heat spreader 26 is preferably dimensioned to substantially cover the upper surface of stiffener 24. In order to be effective, heat spreader 26 preferably has a vertical thickness greater than or equal to about 0.5 mm. Attached directly to the entire upper surface of chip 10, heat spreader 26 efficiently conducts heat energy from chip 10 either to a heat sink attached to a substantially planar upper surface of heat spreader 26 or, in the absence of such an attached heat sink, to an ambient surrounding semiconductor device 20.

Following the C4 process, a layer of a thermal interface material 40 is formed upon the upper surface of chip 10, and an underside surface of heat spreader 26 is attached to an upper surface of substrate 22. A select quantity of a thermally conductive thermal interface material which flows under pressure (e.g., thermally conductive epoxy or thermal grease) is preferably deposited in the center of the upper surface of chip 10. The free ends of grounding leads 16 are positioned over the upper surface of stiffener 24 as shown in FIG. 3. An electrically and thermally conductive adhesive material which flows under pressure is deposited upon the upper surface of stiffener 24 and around the free ends grounding leads 16. Heat spreader 26 is then positioned above stiffener 24 and lowered until an underside surface 44 of heat spreader 26 contacts the thermal interface material upon chip 10 and the adhesive material. Sufficient downward pressure is applied to the upper surface of heat spreader 26 such that the thermal interface material spreads out between the upper surface of chip 10 and the adjacent portion of the underside of heat spreader 26 to form thermal interface layer 40 therebetween. The adhesive material deposited upon the upper surface of stiffener 24 and around the free ends of grounding leads 16 spreads out to form adhesive layer 42 which attaches the underside surface of heat spreader 26 to the upper surface of stiffener 24, with grounding leads 16 electrically coupled therebetween.

Thermal interface layer 40 may be, for example, a layer of a thermally conductive epoxy compound including particles of a thermally conductive material (e.g., silver, aluminum, boron nitride, etc.). A suitable epoxy is Abelstik No. 965-1L, a silver-filled epoxy (Abelstik Co., Rancho Dominguez, Calif.). Alternately, thermal interface layer 40 may be a layer of thermal grease, thermal wax, or a piece of thermal interface tape.

Adhesive layer 42 may be, for example, a layer of an electrically and thermally conductive epoxy compound including particles of an electrically and thermally conductive material (e.g., silver, aluminum, etc.). A suitable epoxy is Abelstik No. 965-1L, a silver-filled epoxy (Abelstik Co., Rancho Dominguez, Calif.).

The use o f grounding leads 16 to connect the electrically conductive stiffener 24 and heat spreader 26 to an electrical ground potential forms an electromagnetic shield around semiconductor device 20. As a result, the radiation of electrical energy from and the coupling of electrical energy into, electrical circuits of chip 10 during operation is substantially reduced. The effectiveness of the electromagnetic shield may be increased by any ground planes existing within chip 10 or substrate 22.

Figure 4:
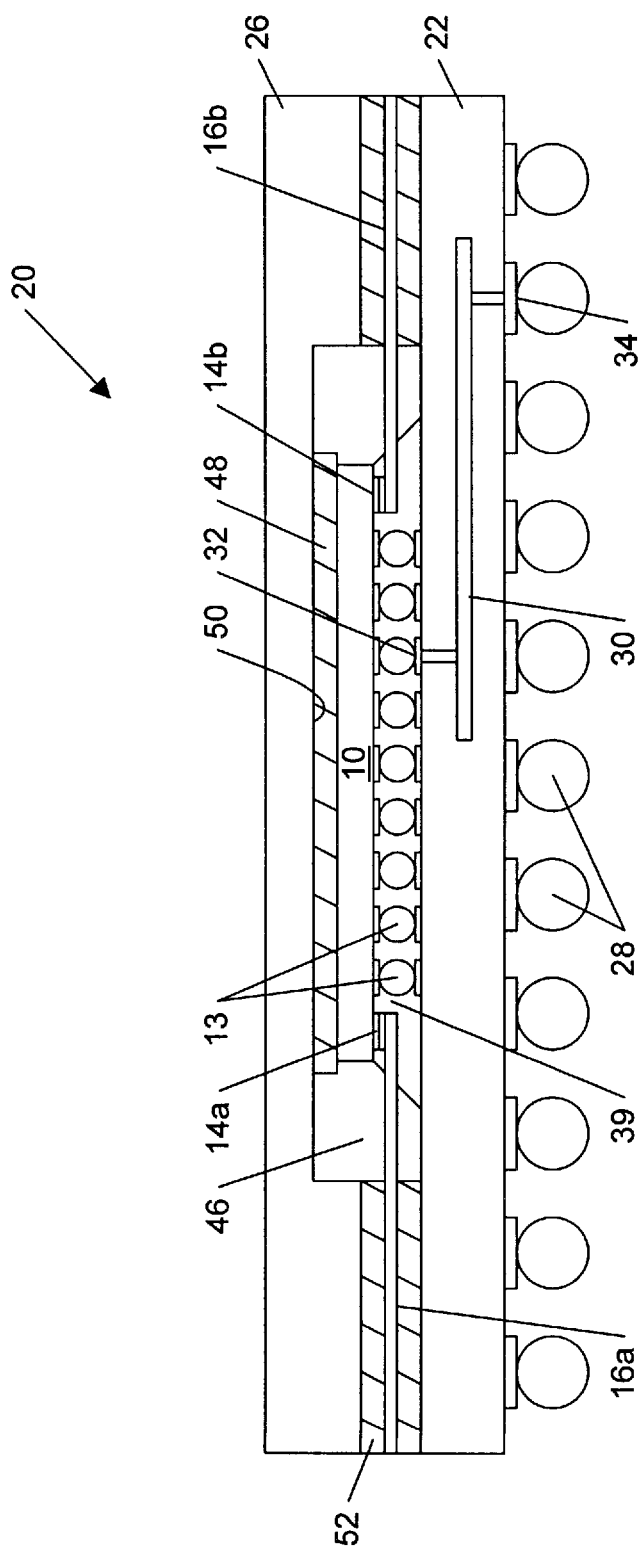
FIG. 4 is a cross-sectional view of a second embodiment of the semiconductor device of FIG. 3, wherein the semiconductor device includes the integrated circuit of FIG. 2 and an electrically conductive heat spreader which partially encloses the integrated circuit, and wherein the heat spreader is electrically coupled to the electrical ground potential by the grounding leads, forming an electromagnetic shield about the integrated circuit.

FIG. 4 is a cross-sectional view of a second embodiment of semiconductor device employing a heat spreader 26 attached directly to substrate 22. In this case, 20 heat spreader 26 has a cavity 46 in an underside surface dimensioned to receive chip 10. In this embodiment, Substrate 22 maintains a substantially planar shape when exposed to a maximum C4 temperature of about 230 degrees Celsius. By using grounding leads 16 to connect the electrically conductive heat spreader 26 to an electrical ground potential, an electromagnetic shield is formed around semiconductor device 20.

Following the C4 process and prior to the attachment of heat spreader 26 to substrate 22, a select quantity of a thermally conductive thermal interface material which flows under pressure (e.g., thermally conductive epoxy or thermal grease) is preferably deposited in the center of the upper surface of chip 10. A layer of the thermal interface material 48 is formed between the upper surface of chip 10 and an upper wall 50 of cavity 46 of heat spreader 26 as described above when heat spreader 26 is attached to substrate 22.

Heat spreader 26 is preferably dimensioned to substantially cover the upper surface of substrate 22. Cavity 46 of heat spreader 26 is located substantially in the center of the underside surface of heat spreader 26. The periphery of the underside surface of heat spreader 26 is attached to the periphery of the upper surface of substrate 22. The free ends of grounding leads 16 are positioned over the upper surface of substrate 22 as shown in FIG. 4. An electrically and thermally conductive adhesive material is deposited about the perimeter of the upper surface of substrate 22 and around the free ends of grounding leads 16. Heat spreader 26 is then positioned above substrate 22 and lowered until an upper wall 50 of cavity 46 contacts the thermal interface material upon chip 10, and an underside surface of heat spreader 26 contacts the adhesive material. Sufficient downward pressure is applied to the upper surface of heat spreader 26 such that the thermal interface material spreads out between the upper surface of chip 10 and the adjacent portion of the upper wall 50 of cavity 46 to form thermal interface layer 48 therebetween. As with thermal interface layer 40, thermal interface layer 48 is preferably only a "bond line thickness" (between about 0.05 mm and approximately 0.08 mm) of the thermal interface material in order to reduce the thermal resistance between chip 10 and heat spreader 26. The adhesive material deposited upon the upper surface of substrate 22 and around the free ends of grounding leads 16 spreads out to form adhesive layer 52 which attaches the underside surface of heat spreader 26 to the upper surface of substrate 22.

Thermal interface layer 48 may be, for example, a layer of a thermally conductive epoxy compound including particles of a thermally conductive material (e.g., silver, aluminum, boron nitride, etc.). A suitable epoxy is Abelstik No. 965-1L, a silver-filled epoxy (Abelstik Co., Rancho Dominguez, Calif.). Alternately, thermal interface layer 48 may be a layer of thermal grease, thermal wax, or a piece of thermal interface tape.

Adhesive layer 52 may be, for example, a layer of an electrically and thermally conductive epoxy compound including particles of an electrically and thermally conductive material (e.g., silver, aluminum, etc.). A suitable epoxy is Abelstik No. 965-1L, a silver-filled epoxy (Abelstik Co., Rancho Dominguez, Calif.).

Figure 5:
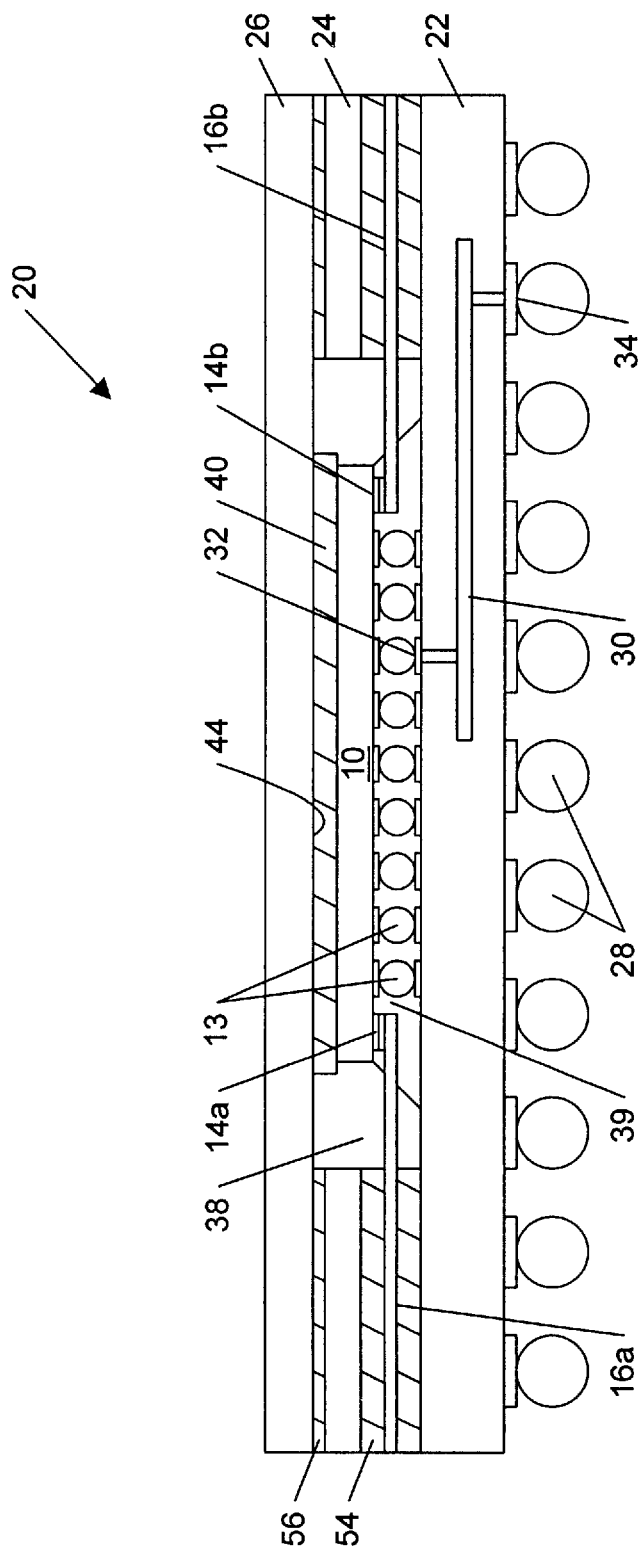
FIG. 5 is a cross-sectional view of a third embodiment of a semiconductor device employing electromagnetic shielding in accordance with the present invention, wherein the semiconductor device includes the integrated circuit of FIG. 2, a substrate, and an electrically conductive stiffener and heat spreader which partially enclose the integrated circuit, and wherein the grounding leads, interposed between the substrate and the stiffener, electrically couple the heat spreader and the stiffener to the electrical ground potential, thereby forming an electromagnetic shield about the integrated circuit.

FIG. 5 is a cross-sectional view of a third embodiment of semiconductor device 20 employing the electromagnetic shielding of the present invention. As in the first embodiment of FIG. 3, semiconductor device 20 includes chip 10, substrate 22, stiffener 24, and heat spreader 26. In this case, stiffener 24 is attached to the periphery of the upper surface of substrate 22 after chip 10 is mounted upon substrate 22 using the controlled collapse chip connection (C4) or "flip chip" method. As in the second embodiment of FIG. 4, substrate 22 maintains its substantially planar shape when exposed to maximum C4 temperatures of about 230 degrees Celsius.

Following the mounting of chip 10 upon the upper surface of substrate 22, an electrically and thermally conductive adhesive material is deposited about the perimeter of the upper surface of substrate 22 and around the free ends of grounding leads 16. Stiffener 24 is then positioned above substrate 22 and lowered until an underside surface of stiffener 24 contacts the adhesive material. Sufficient downward pressure is applied to the upper surface of stiffener 24 such that the adhesive spreads out between the upper surface of substrate 22 and the underside surface of stiffener 24 to form an adhesive layer 54 therebetween. Adhesive layer 54 attaches stiffener 24 to the upper surface of substrate 22, with grounding leads 16 electrically coupled therebetween.

Adhesive layer 54 may be, for example, a layer of an electrically and thermally conductive epoxy compound including particles of an electrically and thermally conductive material (e.g., silver, aluminum, etc.). A suitable epoxy is Abelstik No. 965-1L, a silver-filled epoxy (Abelstik Co., Rancho Dominguez, Calif.).

Following attachment of stiffener 24 to the upper surface of substrate 22, cavity 38 is formed between chip 10, stiffener 24, and substrate 22. As in the first embodiment of FIG. 3, cavity 38 may be substantially filled with a thermally conductive C4 underfill material. Alternately, a portion 39 of cavity 38 between the underside of chip 10 and the corresponding portion of the upper surface of substrate 22 may be filled with the underfill material, and the remaining portion of the cavity between the side surfaces of chip 10 and the side walls of the opening in stiffener 24 may be filled with a thermal interface material (e.g., thermally conductive epoxy or thermal grease).

The C4 underfill material may be, for example, a liquid which hardens over time. The liquid may be initially dispensed along one or more sides of chip 10, using capillary action to fill the space between the underside of chip 10 and the corresponding portion of the upper surface of substrate 22. For example, the underfill material may be an epoxy compound including suspended particles of a thermally conductive and electrically insulating material (e.g., silica). A suitable adhesive material is Dexter HYSOL® No. 4527, a silica-filled epoxy (Dexter Electronic Materials, Industry, CA). The underfill material encapsulates the C4 connections and provides other mechanical advantages. The underfill material (or thermal interface material) which brings the side surfaces of chip 10 into thermal communication with stiffener 24 provides additional thermal paths for heat energy to flow from chip 10 to the ambient via stiffener 24, heat spreader 26, and substrate 22.

Following attachment of stiffener 24 and the underfill process, a layer of a thermal interface material 40 is formed upon the upper surface of chip 10, and an underside surface of heat spreader 26 is attached to an upper surface of substrate 22. A select quantity of a thermally conductive thermal interface material which flows under pressure (e.g., thermally conductive epoxy or thermal grease) is preferably deposited in the center of the upper surface of chip 10. An electrically and thermally conductive adhesive material which flows under pressure is deposited upon the upper surface of stiffener 24. Heat spreader 26 is then positioned above stiffener 24 and lowered until an underside surface 44 of heat spreader 26 contacts the thermal interface material upon chip 10 and the adhesive material. Sufficient downward pressure is applied to the upper surface of heat spreader 26 such that the thermal interface material spreads out between the upper surface of chip 10 and the adjacent portion of the underside of heat spreader 26 to form thermal interface layer 40 therebetween. The adhesive material deposited upon the upper surface of stiffener 24 spreads out to form adhesive layer 56 which attaches the underside surface of heat spreader 26 to the upper surface of stiffener 24. As in the first embodiment of FIG. 3, grounding leads 16 connect the electrically conductive stiffener 24 and heat spreader 26 to an electrical ground potential, forming an electromagnetic shield around semiconductor device 20.

As described above, thermal interface layer 40 may be, for example, a layer of a thermally conductive epoxy compound including particles of a thermally conductive material (e.g., silver, aluminum, boron nitride, etc.). A suitable epoxy is Abelstik No. 965-1L, a silver-filled epoxy (Abelstik Co., Rancho Dominguez, Calif.). Alternately, thermal interface layer 40 may be a layer of thermal grease, thermal wax, or a piece of thermal interface tape.

Adhesive layer 56 may be, for example, a layer of an electrically and thermally conductive epoxy compound including particles of an electrically and thermally conductive material (e.g., silver, aluminum, etc.). A suitable epoxy is Abelstik No. 965-1L, a silver-filled epoxy (Abelstik Co., Rancho Dominguez, Calif.).

Numerous variations and modifications will become apparent to those skilled in the art once the above disclosure is fully appreciated. It is intended that the following claims be interpreted to embrace all such variations and modifications.

What is claimed is:

1. An assembly, comprising:

a monolithic integrated circuit having a plurality of input/output (I/O) pads arranged upon a surface of the integrated circuit, wherein the plurality of I/O pads are spaced across a central portion and a surrounding peripheral portion of the integrated circuit, and wherein each member of the peripheral portion is connected to an electrical ground potential;

a substrate having a plurality of electrically conductive bonding pads extending to a surface of said substrate in coupled alignment with members of the central portion of the plurality of I/O pads; and a thermally and electrically conductive heat spreader, wherein the heat spreader is thermally coupled to the integrated circuit, and wherein the heat spreader is electrically coupled to at least one member of the peripheral portion of the I/O pads of the integrated circuit so as to form an electromagnetic shield partially surrounding and proximate to the integrated circuit.

2. The assembly as recited in claim 1, wherein the integrated circuit comprises at least one electronic device formed upon a monolithic semiconductor substrate.

3. The assembly as recited in claim 1, wherein the plurality of I/O pads of the integrated circuit are arranged as a two dimensional array having rows and columns, and wherein the peripheral portion of the plurality of I/O pads comprises members of the outermost rows and columns.

4. The assembly as recited in claim 1, wherein the heat spreader is electrically coupled to the at least one member of the peripheral portion of the I/O pads of the integrated circuit by a grounding lead.

5. The assembly as recited in claim 4, wherein the grounding lead is a metal foil strip or a wire.

6. The assembly as recited in claim 1, further comprising a thermally electrically conductive stiffener interposed between the substrate and the heat spreader, wherein the stiffener comprises an opening, and wherein the integrated circuit resides within the opening.

7. The assembly as recited in claim 1, wherein members of the central portion of the plurality of I/O pads of the integrated circuit are coupled to the bonding pads of the substrate with respective solder bumps.

8. The assembly as recited in claim 7, wherein the solder bumps couple members of the central portion of the plurality of I/O pads of the integrated circuit to the bonding pads of the substrate when heated.

9. The assembly as recited in claim 6, wherein the stiffener retains a substantially planar shape when exposed to maximum thermal energy of about 230 degrees C.

10. The assembly as recited in claim 7, wherein the heat spreader is electrically coupled to the stiffener.

11. The assembly as recited in claim 7, wherein the heat spreader is attached to the stiffener by a layer of an electrically and thermally conductive adhesive.

12. The assembly as recited in claim 1, wherein the heat spreader comprises an underside surface having a cavity, and wherein the integrated circuit resides within the cavity, and wherein the underside surface is attached to the surface of the substrate.

* * * * *